United States Patent
Chang et al.

(10) Patent No.: US 6,608,377 B2
(45) Date of Patent: Aug. 19, 2003

(54) WAFER LEVEL PACKAGE INCLUDING GROUND METAL LAYER

(75) Inventors: Tae-Sub Chang, Seoul (KR); Dong-Ho Lee, Seoul (KR); Min-Young Son, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/006,180

(22) Filed: Dec. 4, 2001

(65) Prior Publication Data

US 2002/0100960 A1 Aug. 1, 2002

(30) Foreign Application Priority Data

Jan. 30, 2001 (KR) .......................................... 2001-4245

(51) Int. Cl.[7] .............................................. H01L 23/12
(52) U.S. Cl. ....................... 257/700; 257/701; 257/758; 257/781; 257/786; 438/612; 438/613
(58) Field of Search ................................. 257/701, 702, 257/703, 737, 738, 778, 779, 780, 781, 758, 786; 438/108, 612, 613, 614

(56) References Cited

U.S. PATENT DOCUMENTS

| | | | |
|---|---|---|---|
| 5,851,911 A | | 12/1998 | Farnworth |
| 6,078,100 A | | 6/2000 | Duesman et al. |
| 6,117,299 A | * | 9/2000 | Rinne et al. ................ 205/125 |
| 6,452,256 B1 | * | 9/2002 | Kazama et al. ............. 257/668 |
| 6,518,675 B2 | * | 2/2003 | Kim et al. .................. 257/773 |

FOREIGN PATENT DOCUMENTS

| | | | | |
|---|---|---|---|---|
| EP | 877419 A2 | * | 11/1998 | ........... H01L/21/60 |
| JP | 01209746 A | * | 8/1989 | ........... H01L/21/92 |
| JP | 02271635 A | * | 11/1990 | ......... H01L/21/321 |
| JP | 10-284638 | | 10/1998 | |
| JP | 11-121647 | | 4/1999 | |

OTHER PUBLICATIONS

English language abstract for Japanese Patent No. 11–121647.
English language abstract for Japanese Patent No. 10–284638.

* cited by examiner

Primary Examiner—David L. Talbott
Assistant Examiner—Alonzo Chambliss
(74) Attorney, Agent, or Firm—Marger Johnson & McCollom P.C.

(57) ABSTRACT

A semiconductor chip package includes a ground metal layer disposed in close proximity to a signal layer for carrying electrical input and output signals to and from the chip. The ground metal layer has a plate structure and is formed by two metal plates or a single metal plate having openings for the electrode pads of the chip. Because the ground trace is nearest to the signal trace, the loop area formed by a signal current and its return current is reduced and, therefore, loop inductance is reduced as well. Further, because of the plate structure of the ground trace and its proximity to the signal trace, the inductive element and parasitic parameters due to the signal trace can be significantly reduced and the electrical performance of high-frequency semiconductor IC devices is greatly improved, especially when applied to wafer level packaging IC devices.

20 Claims, 6 Drawing Sheets

WAFER LEVEL PACKAGE INCLUDING GROUND METAL LAYER

This application relies for priority upon Korean Patent Application No. 2001-04245, filed on Jan. 30, 2001, the contents of which are herein incorporated by reference in their entirety.

BACKGROUND OF THE INVENTION

1. Field of the Invention

This invention relates to a semiconductor packaging technology, and more particularly to wafer level packages.

2. Description of Related Art

Generally, semiconductor chips are packaged to carry electrical input and output signals to and from the external world and to physically protect the semiconductor chips from external environment. It has long been desired to provide low-cost semiconductor chip packages that are lighter, smaller, with higher speed, multi-function, and improved reliability. Various packaging technologies have been developed to achieve this goal. For example, a ball grid array (BGA) package provides a relatively high surface-mount density and improved electrical performance when compared with a conventional plastic package having a metal lead frame. The BGA comprises an array of minute solder balls disposed on conductive locations of a semiconductor chip. The solder balls are refluxed for simultaneous attachment and electrical communication between the semiconductor chip and conductors of a printed circuit board or other substrate. A primary difference between the BGA package and a conventional plastic package is that the electrical connection of the semiconductor chip is provided by a substrate having multiple layers with circuit patterns instead of by a lead frame as in a plastic package. The BGA package can follow the trend of ever-increasing numbers of input/output pins, greatly reduce inductive component of electrical connection, and reduce the package size to the chip scale.

Further developments from the BGA technology have created wafer level packages (WLPs). Because the WLPs adopt area array packaging concepts of the BGA packages, it is possible to make the package outline the size of the chip itself. Thus, the WLP has been an area of rapidly growing interest to the packaging community. Here the finished devices are not chip scale but rather chip size. The WLP is defined as the complete packaging of a component at the wafer level. The WLP process must provide the complete packaging solution with no additional processing at the die level either during fabrication or assembly. The WLP utilizes equipment and processes that process all dies on the wafer simultaneously during each step. A true WLP allows, for the first time, the ability to keep the cost of the IC package a relatively constant percentage of the total IC cost. Historically, with standard IC packaging technology, the cost of the package became a greater percentage of the total IC cost as the size of the semiconductor die shrinks. In some applications, the cost of individual IC packaging has exceeded the cost of the IC itself. One significant advantage of the WLP is the potential to fully integrate the function of the package with the function of the chip. Thus, power and ground distribution and global wire route or critical clocks could be accommodated with relatively thick, wide, and highly conductive copper. Such an approach can reduce pin counts on the package while either increasing performance, reducing the power requirement, or potentially both.

FIG. 1 is a partial cross-sectional view of a conventional WLP device. A plurality of semiconductor chips (not designated in the drawings) are formed in a silicon wafer 2, and on-chip circuits are formed in each of the chips by a batch wafer fabrication process. In order to simplify the drawings, only a metal layer 3 of the on-chip circuit is shown to be formed on top of the on-chip circuit in FIG. 1. The metal layer 3 is connected to electrode pads 4 for external interconnection of the semiconductor chip. An upper surface of the wafer 2, i.e., an active surface of the semiconductor chip is generally covered with a passivation layer except for the electrode pads 4. Onto the passivation layer are formed a dielectric layer 5 and a metal layer 6, which is in contact with the exposed electrode pads 4. An additional dielectric layer 7 is formed on the metal layer 6. At this time, an area for external connections (e.g., solder balls 9) remains open through the dielectric layer 7. Through the open area of the dielectric layer 7, solder balls 9 are electrically connected to the metal wiring 6, so that external electrical connections for the semiconductor chip on the wafer are completed.

However, in this conventional structure, it is difficult to solve parasitic problems that occur as the frequency of electrical signals conducted by the metal wiring 6 increases. For example, the electrical performance of high-speed semiconductor chips is mainly dependent upon the design and disposition of the metal wiring 6 consisting of power lines, signal lines and ground lines. With the conventional WLP structure, it is difficult to effectively control inductance, capacitance, and parasitic elements due to the signal line and, at the same time, to guarantee the electrical performance and reliability of high-speed semiconductor IC devices.

SUMMARY OF THE INVENTION

The present invention contemplates a wafer level package assuring electrical performance and reliability of semiconductor chips operating at higher frequency.

The present invention provides a wafer level package that reduces parasitic parameters and inductance generated from signal lines.

A wafer level package of the present invention having a ground metal plate reduces the parasitic parameters and inductance generated by the signal line, and increases design discretion of signal patterns.

In an embodiment of the present invention, a wafer level package includes: (a) a semiconductor chip with an active surface including signal electrode pads, ground electrode pads, and on-chip circuits; the signal electrode pads for carrying electrical signals to and from the semiconductor chip, and the ground electrode pads for carrying ground power signal; (b) a first dielectric layer formed on the active surface to expose the signal and ground electrode pads; (c) a first metal layer formed on the first dielectric layer and including a ground metal layer in contact with the ground electrode pads, the first metal layer comprises a plate structure; (d) a second dielectric layer formed on the first metal layer and having a ground contact opening for the ground electrode pads and a signal contact opening for the signal electrode pads; (e) a second metal layer formed on the second dielectric layer and having ground and signal patterns, the ground patterns being connected to the ground electrode pads via the ground contact opening, and the signal patterns being connected to the signal electrode pads via the signal contact opening; and (f) external connections electrically connected to the ground and the signal patterns of the second metal layer and for providing an electrically conducting path for the semiconductor chip to the external world.

In another embodiment of present invention, a wafer level package further includes a third dielectric layer, a third metal layer, a fourth dielectric layer and a fourth metal layer corresponding to the first dielectric layer, the first metal layer, the second dielectric layer, and the second metal layer, respectively, overlying the semiconductor chip.

The metal layers, metal pattern layers and dielectric layers are formed in a batch wafer process for fabricating the on-chip circuits on a wafer.

These and other features and advantages will be more clearly understood from the following detailed description in conjunction with the accompanying drawings. It is important to point out that the illustrations may not necessarily be drawn to scale, and that there may be other embodiments of this invention that are not specifically illustrated.

BRIEF DESCRIPTION OF THE INVENTION

DETAILED DESCRIPTION OF PREFERRED EMBODIMENTS

Figure 1:
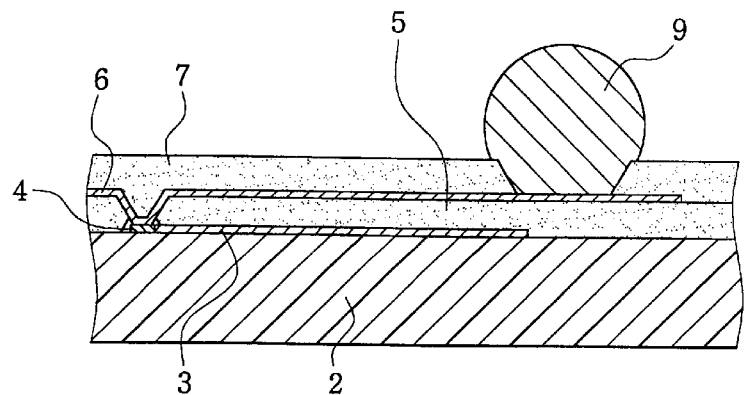
FIG. 1 is a partial cross-sectional view of a conventional wafer level package.
Figure 2:
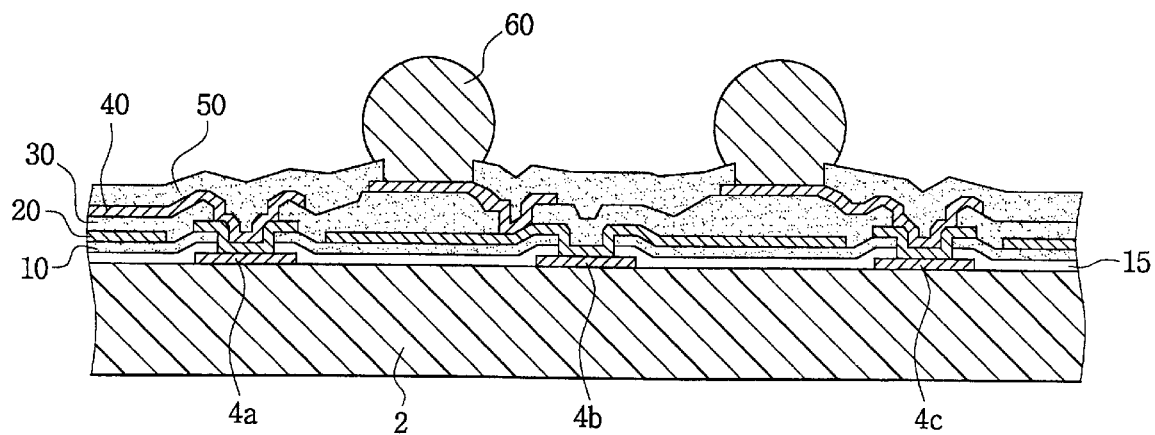
FIG. 2 is a partial cross-sectional view of a wafer level package according to the present invention.

FIG. 2 shows, in a cross-sectional view, a wafer level package according to the present invention, and FIGS. 3a to 3g illustrate a process for manufacturing such a wafer level package.

Figure 3A:
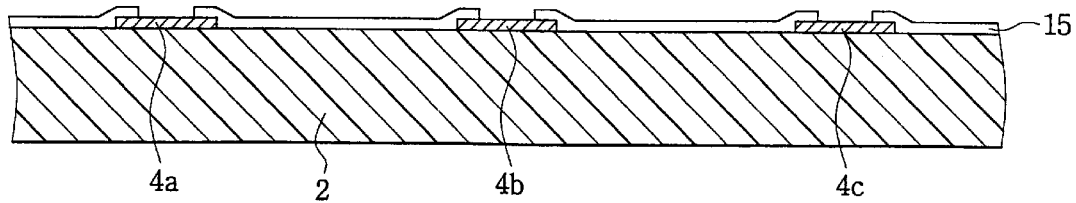
FIGS. 3a to 3g illustrate processing steps for manufacturing a wafer level package according to the present invention.

As shown in FIG. 3a, a plurality of semiconductor chips are formed on the semiconductor wafer 2, e.g., a silicon wafer, and a plurality of electrode pads, i.e., signal electrode pads 4a and 4c and ground electrode pads 4b are formed on the top surface of the wafer. The signal electrode pads 4a and 4c are paths for electrical signals such as control signals, address signals, input/output signals and power (Vdd or Vcc) signals to and from the semiconductor chips. The ground electrode pads 4b provide ground path to the electrical signals. It is well understood by one skilled in the art that the electrode pads 4 are electrically connected to on-chip circuits that are formed in the wafer but not specifically shown in the drawings for simplicity. The electrode pads 4 are made of a conductive metal such as aluminum. The surface of the semiconductor wafer 2 is covered with a passivation layer 15 except for the electrode pads 4 exposed to form an external electrical conducting path. The passivation layer 15 is formed, for example, by performing chemical vapor deposition (CVD) of Phosphor-Silicate Glass (PSG) film or a film including SiO2 and Si3N4 and then by etching the deposited film.

Figure 3B:
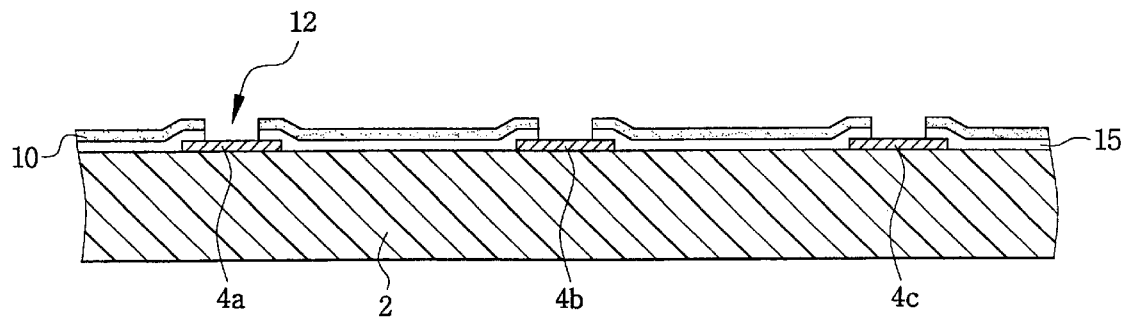

As shown in FIG. 3b, a first insulating or dielectric material is deposited on the passivation layer 15 and etched away to expose the electrode pads 4, forming a first dielectric layer pattern 10. The dielectric layer pattern 10 may be made of a polymer.

Figure 3C:
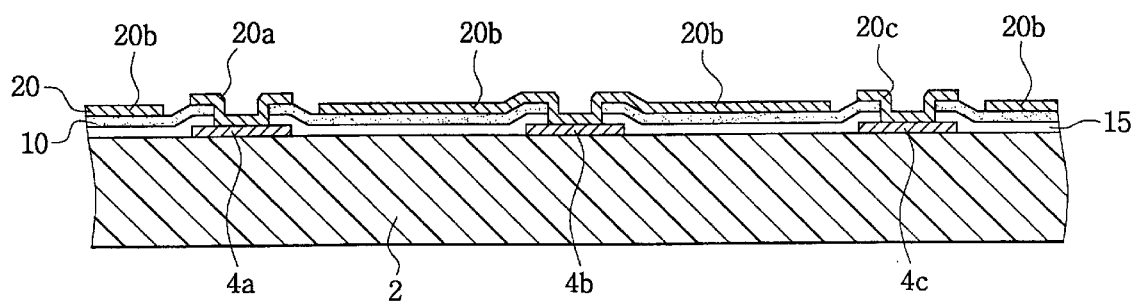
Figure 3D:
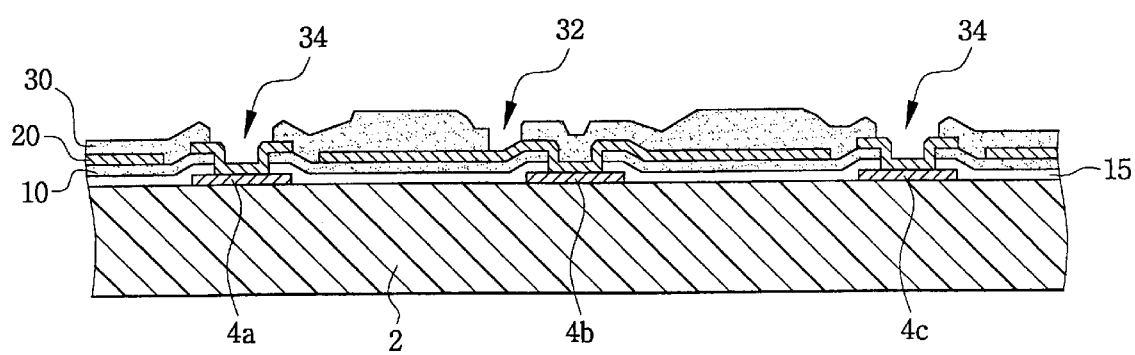

Referring to FIG. 3c, metal is deposited on the first dielectric layer pattern 10 and etched to form a first metal layer 20. The first metal layer 20 provides ground and power to the chip. The first metal layer 20 includes a ground metal layer 20b and contact patterns 20a and 20c. The ground metal layer 20b is connected to the ground electrode pad 4b. The contact patterns 20a and 20c, connected to signal electrode pads 4a and 4c, are to connect other metal layers (for example, a metal layer 40 in FIG. 3e) and signal electrode pads 4a and 4c as will be explained in detail below. It may be possible, in the step of FIG. 3c, to remove the contact patterns 20a and 20c by an etching process. However, it is preferable to keep the contact patterns 20a and 20c for maintaining a planar top surface on which an upper metal layer 40 can be formed. The first metal layer 20 is, for example, made of copper. In one embodiment of the present invention, the first metal layer 20 may be formed by sequentially sputtering titanium, copper, and titanium.

After formation of the ground metal layer 20b, as shown in FIG. 3c, a signal contact 34 (FIG. 3d) to the signal electrode pads 4a and 4c and a ground contact 32 to the ground electrode pad 4b are formed by depositing and etching a second dielectric layer 30 on the first metal layer 20. The second dielectric layer 30 is made of a material identical to the first dielectric layer 10.

Figure 3E:
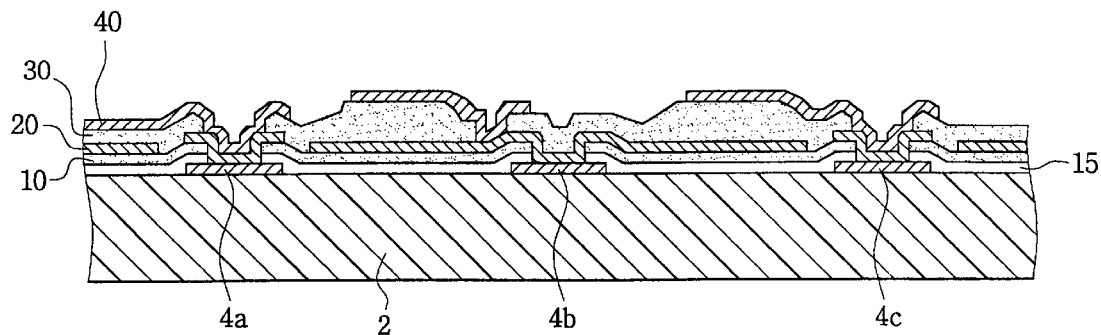

In FIG. 3e, a second metal layer 40 is formed on the second dielectric layer 30. The second metal layer 40 is made of identical material to the first metal layer 20. In one embodiment of the present invention, the second metal layer 40 may be formed by sequentially sputtering chromium and copper, and plating nickel on the sputtered structure. The chromium is employed in consideration of the adhesiveness to a polyimide layer (a second dielectric layer) and acts as a barrier layer between the copper electrodes and the polyimide layer. Further, the nickel is sputter deposited as a solder barrier to the solder balls and prevents oxidation. In order to assure that the thickness of the second metal layer is sufficient, it is possible to further deposit a plated copper layer on the sputtered copper layer.

Figure 3F:
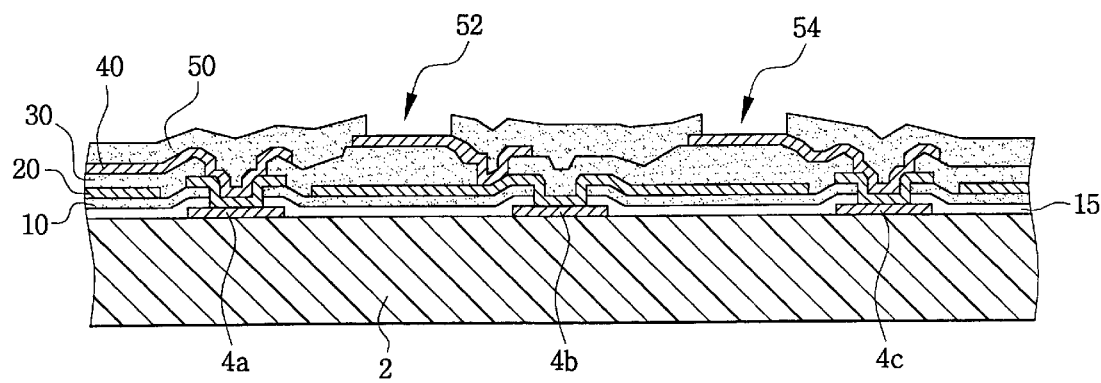

The second metal layer 40 includes patterns connected to the signal contact 34 and other patterns connected to the ground contact 32. As shown in FIG. 3f, ground solder ball lands 52 and signal solder ball lands 54 are formed by depositing and etching a third dielectric layer 50 on the second metal layer 40.

Figure 3G:
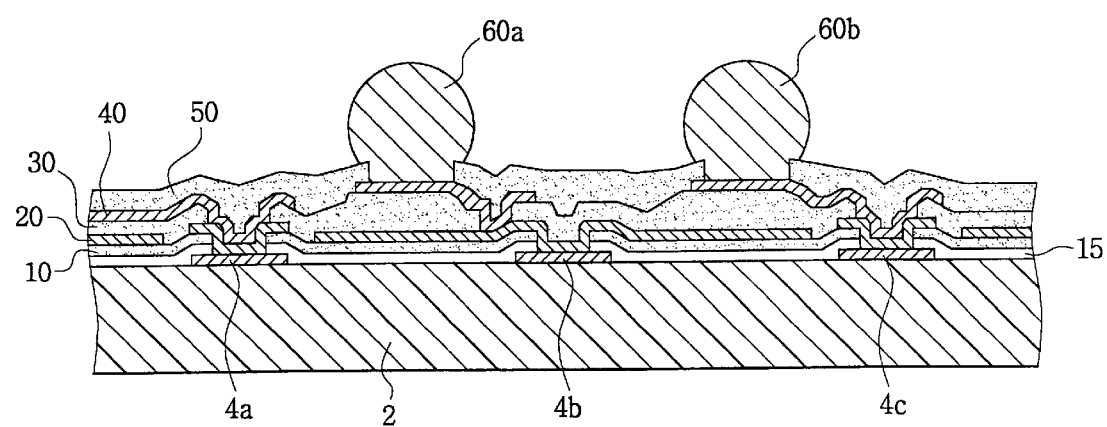

Referring to FIG. 3g, solder balls 60a and 60b are attached to the solder ball lands 52 and 54. The attachment of the solder balls 60 may be achieved by conventional methods used in normal BGA packaging processes.

Figure 4A:
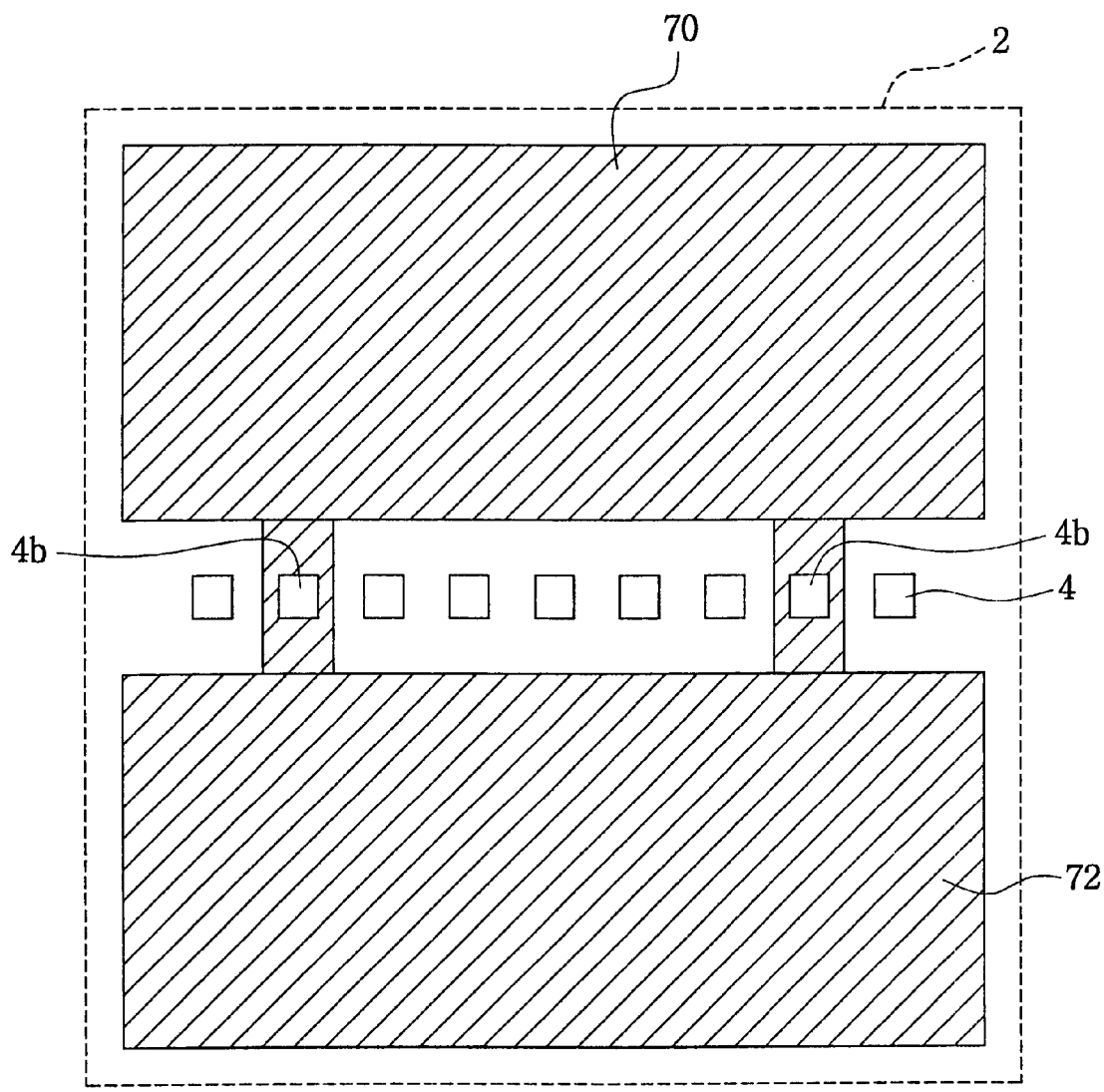
FIGS. 4a to 4c are schematic cross-sectional views of various ground metal layers according to the present invention.
Figure 4B:
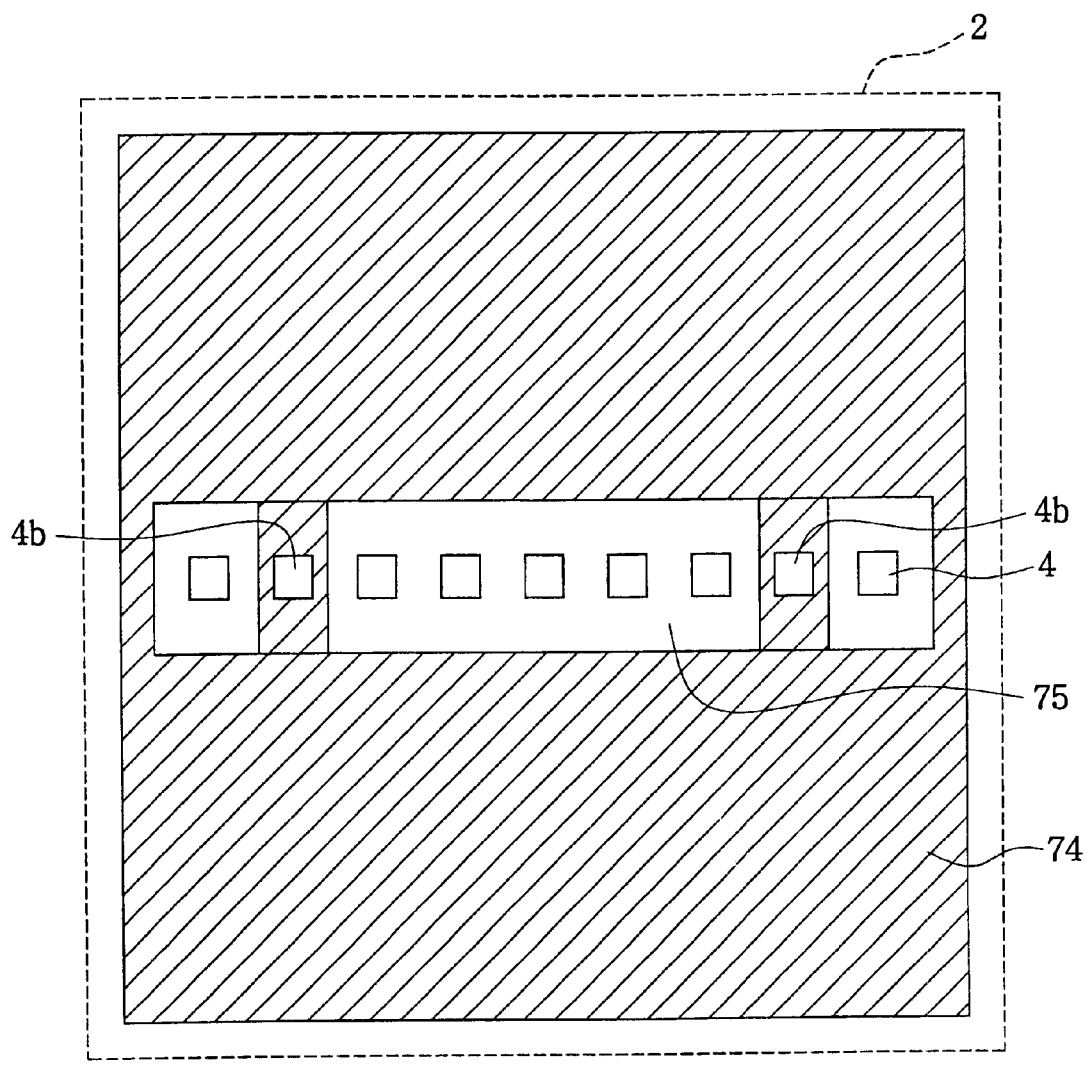

In one embodiment of the present invention, the ground metal layer 20b of the first metal layer 20 is formed by a metal plate having various shapes. For example, the ground metal plate may have, as shown in FIG. 4a, a structure such that two ground plates 70 and 72 are disposed symmetrically about electrode pads 4 located at the central region of the semiconductor chip 2. The ground metal plate may have a single metal body 74 with openings 75 for exposing the electrode pads 4 disposed at the central region of the semiconductor chip 2, as shown in FIG. 4b.

Figure 4C:
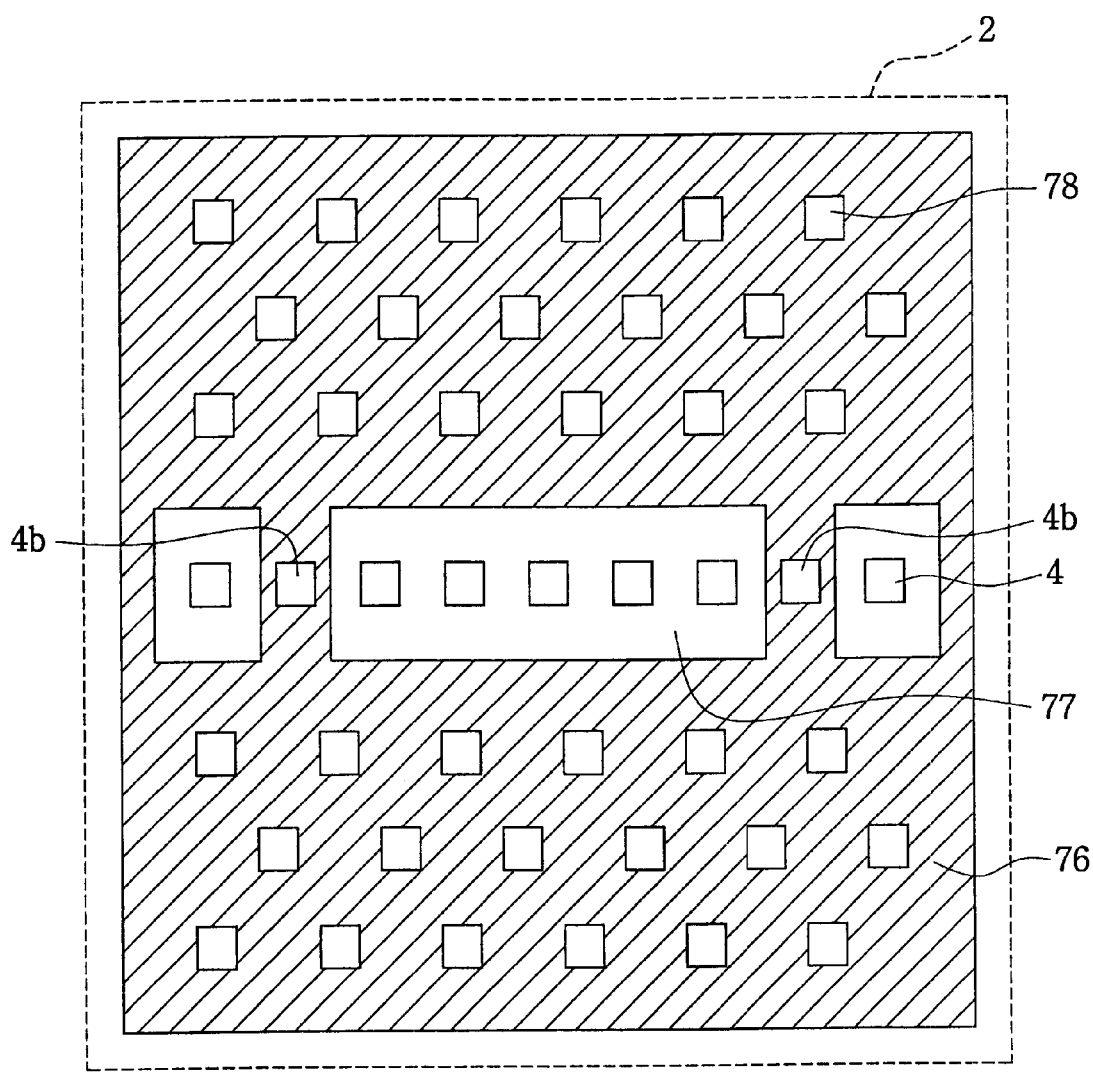

Referring to FIG. 4c, a ground plane may be formed by a single metal plate 74 having openings 77 for exposing centrally disposed electrode pads of the chip and a plurality of through holes 78. The through holes 78 improve adhesive strength of the dielectric layers 10 and 30 by directly contacting the second dielectric layer 30 on the ground plate with the first dielectric layer 10 formed below the ground plate.

In the process illustrated in FIG. 3, when the ground metal layer 20b is formed in the plate structure, the first dielectric layer 10 forming step (FIG. 3b), the first metal layer 20 forming step (FIG. 3c), the second dielectric layer 30 forming step (FIG. 3d) and the second metal pattern 40 forming step (FIG. 3e) may be repeated to form a multi-layered metal structure for the wafer level package, resulting in improved electrical characteristics. In this embodiment, which has a plate-shaped ground layer, parasitic parameters are further reduced by the ground metal plate so that operational characteristic and electrical performance of the package device can be optimized at high frequency.

Further, by forming the ground layer with a separate metal plate, design discretion for metal patterns of signal conducting layers can be improved. That is, in the conventional structure having a ground pattern and signal patterns formed in a single metal layer, signal pattern design is limited by the area occupied by each of the patterns. In contrast, according to the structure of the present invention, designers can more freely dispose or lay out signal layers in the area saved in the signal metal layer by the separate ground plate. This makes it possible to optimize the signal layer design or signal pattern layout.

The present invention can be applied to various types of semiconductor chips including flash memory chips, DRAMs and micro-controllers, and in particular to semiconductor IC devices operating at high frequency.

The wafer level package according to the present invention can minimize inductance and parasitic factors generated by signal patterns. A loop inductance is defined by an imaginary area formed by a current flowing in a signal pattern and a feedback image current flowing in a ground path corresponding to the signal pattern. Since the feedback image current flows in a path having minimum inductance, the feedback path is formed in the ground layer in close proximity to the signal pattern. As a result, if the distance between the ground layer and the signal pattern is minimized, the loop area and in turn the loop inductance is minimized as well. The loop inductance can be expressed by:

$$L_I = (L_{SIG} + L_{GND} - 2L_{SIG\_GND})$$

Where, $L_I$ is a loop inductance, $L_{SIG}$ is a self inductance of a signal trace, $L_{GND}$ represents a self inductance of a ground path, and $L_{SIG\_GND}$ is a mutual inductance of the signal trace and the ground path. As apparent from above equation, when a ground path is formed in a plate structure and just below the signal line, the self inductances of the signal line $L_{SIG}$ and the ground path $L_{GND}$ are decreased while the mutual inductance of the signal line and the ground path $L_{SIG\_GND}$ is increased, which results in a decrease of the loop inductance $L_I$. Further, the plate-structured ground path can provide a stable feedback current path for all signal lines.

In the drawings and specification, there have been disclosed typical preferred embodiments of this invention and, although specific terms are employed, they are used in a generic and descriptive sense only and not for purposes of limitation, the scope of this invention being set forth in the following claims.

What is claimed is:

1. A semiconductor chip package comprising:
   a semiconductor chip having signal electrode pads, ground electrode pads, and on-chip circuits, with said signal electrode pads for carrying electrical signals to and from the semiconductor chip, and said ground electrode pads for carrying ground and power signals;
   a first dielectric layer overlying the chip and exposing the signal and the ground electrode pads;
   a first metal layer formed on the first dielectric layer, the first metal layer including a ground metal layer in electrical communication with the ground electrode pads, said first metal layer comprising a plate structure;
   a second dielectric layer formed on the first metal layer, the second dielectric layer having a ground contact opening therethrough and a signal contact opening therethrough; and
   a second metal layer formed on the second dielectric layer, the second metal layer having ground and signal patterns, said ground patterns electrically connected to the ground electrode pads via the ground contact opening, and said signal patterns electrically connected to the signal electrode pads via the signal contact opening.

2. The semiconductor chip package of claim 1, wherein the ground metal layer comprises two metal plates symmetrically disposed about the electrode pads.

3. The semiconductor chip package of claim 1, wherein the ground metal layer includes an opening for exposing the electrode pads.

4. The semiconductor chip package of claim 1, further comprising external connections electrically connected to the ground and the signal patterns of the second metal layer.

5. The semiconductor chip package of claim 4, wherein the external connections are solder balls.

6. The semiconductor chip package of claim 1, wherein the first metal layer includes a contact pattern connected to the signal electrode pads.

7. The semiconductor chip package of claim 1, wherein the first and the second metal layer comprise copper.

8. The semiconductor chip package of claim 1, wherein the metal layers, the metal patterns and the dielectric layers are formed in the same batch process used for fabricating the on-chip circuits.

9. The semiconductor chip package of claim 1, further comprising a third dielectric layer, a third metal layer, a fourth dielectric layer and a fourth metal layer corresponding to the first dielectric layer, the first metal layer, the second dielectric layer and the second metal layer, respectively, overlying the semiconductor chip including the second metal layer.

10. The semiconductor chip package of claim 9, wherein the ground metal layer comprises two metal plates symmetrically disposed about the electrode pads.

11. The semiconductor chip package of claim 9, wherein the ground metal layer includes an opening for exposing the electrode pads.

12. The semiconductor chip package of claim 11, wherein the ground metal layer further comprises a plurality of through holes for connecting the first and the second dielectric layers.

13. The semiconductor chip package of claim 9, wherein the external connections are solder balls.

14. The semiconductor chip package of claim 9, wherein the first metal layer includes a contact pattern connected to the signal electrode pads.

15. The semiconductor chip package of claim 9, wherein the first and the second metal layer comprises copper.

16. The semiconductor chip package of claim 15, wherein the first metal layer is formed by sequentially stacking a titanium metal layer, a copper metal layer and a titanium metal layer.

17. The semiconductor chip package of claim 15, wherein the second metal layer is formed by sequentially stacking a chromium metal layer, a copper metal layer, a nickel metal layer.

18. The semiconductor chip package of claim 9, wherein the metal layers, the metal patterns and the dielectric layers are formed in the same batch process used for fabricating the on-chip circuits.

19. A semiconductor chip package comprising:
   a semiconductor chip having electrode pads;
   a first dielectric layer overlying the chip;
   a first metal layer formed on the first dielectric layer;
   a second dielectric layer formed on the first metal layer; and
   a second metal layer formed on the second dielectric layer,
   wherein one of the first and second metal layers comprises a ground metal layer having a plate structure.

20. The semiconductor chip package of claim 19, wherein the ground metal layer comprises two metal plates symmetrically disposed about the electrode pads.

* * * * *